(12) United States Patent
Deller et al.

(10) Patent No.: US 11,686,797 B2
(45) Date of Patent: Jun. 27, 2023

(54) METHOD AND SYSTEM FOR MOTION COMPENSATION IN HYBRID PET-MR IMAGING

(71) Applicant: GE Precision Healthcare LLC, Wauwatosa, WI (US)

(72) Inventors: Timothy W. Deller, Elm Grove, WI (US); Florian Wiesinger, Bavaria (DE); Floribertus P. Heukensfeldt Jansen, Ballston Lake, NY (US); Anja C. S. Brau, Menlo Park, CA (US); Kristen Ann Wangerin, Waukesha, WI (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 330 days.

(21) Appl. No.: 17/101,908

(22) Filed: Nov. 23, 2020

(65) Prior Publication Data
US 2021/0181282 A1    Jun. 17, 2021

Related U.S. Application Data (60) Provisional application No. 62/947,300, filed on Dec. 12, 2019.

(51) Int. Cl.
*G01R 33/48* (2006.01)
*G01T 1/29* (2006.01)
*G01R 33/567* (2006.01)

(52) U.S. Cl.
CPC .......... *G01R 33/481* (2013.01); *G01T 1/2985* (2013.01); *G01R 33/5676* (2013.01)

(58) Field of Classification Search
CPC .. G01R 33/481; G01R 33/5676; G01T 1/2985
See application file for complete search history.

(56) References Cited

U.S. PATENT DOCUMENTS

| | | | |
|---|---|---|---|
| 9,398,855 B2 * | 7/2016 | Miao | G01R 33/56509 |
| 9,471,976 B2 | 10/2016 | Thiruvenkadam et al. | |
| 9,535,145 B2 | 1/2017 | Demeester et al. | |
| 10,292,671 B2 * | 5/2019 | Sanders | A61B 6/5288 |
| 10,624,599 B2 * | 4/2020 | Feng | G06T 7/33 |

(Continued)

OTHER PUBLICATIONS

Kris Thielemans, Device-less gating for PET ICT using PCA, IEEE Nuclear Science Symposium Conference Record, 2011, pp. 3904-3910.

(Continued)

*Primary Examiner* — Dixomara Vargas
(74) *Attorney, Agent, or Firm* — Andrus Intellectual Property Law, LLP (57) ABSTRACT

A method of controlling and processing data from a hybrid PET-MR imaging system includes acquiring a positron emission tomographic (PET) dataset over a time period, wherein the PET dataset is affected by a quasi-periodic motion of the patient, and acquiring magnetic resonance (MR) data during the time period such that the acquisition time of the MR data relative to the PET dataset is known. A characteristic of the patient motion is then determined based on the PET dataset and the MR data is processed based on the characteristic of patient motion.

20 Claims, 7 Drawing Sheets

(56) References Cited

U.S. PATENT DOCUMENTS

| | | | |
|---|---|---|---|
| 2008/0135769 A1* | 6/2008 | Rosen | G01R 33/481 |
| | | | 250/363.09 |
| 2008/0137930 A1* | 6/2008 | Rosen | G06T 11/005 |
| | | | 382/131 |
| 2008/0287772 A1* | 11/2008 | Declerck | A61B 6/527 |
| | | | 382/131 |
| 2010/0102813 A1* | 4/2010 | Schulz | A61B 6/4417 |
| | | | 324/309 |
| 2012/0305780 A1* | 12/2012 | Thiruvenkadam | A61B 6/037 |
| | | | 600/407 |
| 2013/0320973 A1* | 12/2013 | Fenchel | A61B 6/5288 |
| | | | 324/309 |
| 2014/0355855 A1* | 12/2014 | Miao | A61B 5/055 |
| | | | 382/131 |
| 2016/0045112 A1* | 2/2016 | Weissler | G01T 1/1603 |
| | | | 600/411 |
| 2016/0073993 A1* | 3/2016 | Ouyang | A61B 5/721 |
| | | | 600/411 |
| 2016/0095565 A1* | 4/2016 | Fenchel | A61B 5/113 |
| | | | 600/408 |
| 2016/0135768 A1* | 5/2016 | Wollenweber | A61B 6/463 |
| | | | 600/427 |
| 2016/0161578 A1* | 6/2016 | Weissler | G01R 33/36 |
| | | | 324/309 |
| 2016/0247274 A1* | 8/2016 | Thiruvenkadam | G06T 7/0012 |
| 2017/0100493 A1* | 4/2017 | Sander | A61K 31/4745 |
| 2018/0074144 A1* | 3/2018 | Dezorayev | G01T 1/2985 |
| 2018/0317861 A1* | 11/2018 | Sun | A61B 6/037 |
| 2019/0000408 A1* | 1/2019 | Kesner | G06T 7/262 |
| 2019/0012811 A1* | 1/2019 | Wang | G06T 7/0012 |
| 2019/0101655 A1* | 4/2019 | Wang | A61B 6/037 |
| 2019/0133542 A1 | 5/2019 | Li et al. | |
| 2019/0236816 A1* | 8/2019 | Wang | A61B 6/037 |

OTHER PUBLICATIONS

Furst et al., Motion Correction Strategies for Integrated PET/MR, The Journal of Nuclear Medicine, 2015, pp. 261-269.

Mianber et al., Joint PET-MR respiratory motion models for clinical PET motion correction, Physics in Medicine & Biology 61, No. 17, 2016, pp. 6515-6530.

Chun et al., MRI-based nonrigid motion correction in simultaneous PET/MRI, Journal of Nuclear Medicine 53, No. 8, 2012, pp. 1284-1291.

Catan Ciprian, Motion correction options in PET/MRI, Seminars in nuclear medicine, vol. 45, No. 3, pp. 212-223. WB Saunders, 2015.

Grimm, Self-gated MRI motion modeling for respiratory motion compensation in integrated PET/MRI, Medical image analysis, 2014, pp. 110-120.

* cited by examiner

METHOD AND SYSTEM FOR MOTION COMPENSATION IN HYBRID PET-MR IMAGING

CROSS-REFERENCE TO RELATED APPLICATION

The present application is based on and claims priority to U.S. Provisional Patent Application Ser. No. 62/947,300 filed Dec. 12, 2019, the disclosure of which is incorporated herein by reference.

BACKGROUND

This disclosure generally relates to hybrid PET-MR imaging systems and methods, and more particularly to methods and systems for motion compensation in hybrid PET-MR imaging.

In many cases in medical imaging, motion is unavoidable. For example, in diagnostic PET, acquisition duration is typically about two minutes per bed position. Respiratory motion in patients during PET acquisition leads to blurring in the resulting (static) PET images. This may in turn lead to lower detectability of tumors, inaccurate SUV calculation, and incorrect tumor planning volumes in radiation therapy. The first step in correcting for movement is to gate the data into different motion states. The gating is typically based on information from external devices, such as the chest position for respiratory movement, or an ECG signal for cardiac gating. Various external devices are used for obtaining the gating signal, which are typically devices that have to be placed on the patient such as a respiration monitor (e.g. chest band) and/or an ECG monitor (ECG electrodes).

SUMMARY

This Summary is provided to introduce a selection of concepts that are further described below in the Detailed Description. This Summary is not intended to identify key or essential features of the claimed subject matter, nor is it intended to be used as an aid in limiting the scope of the claimed subject matter.

In one embodiment, a method of controlling and processing data from a hybrid PET-MR imaging system includes acquiring a positron emission tomographic (PET) dataset over a time period, wherein the PET dataset is affected by a quasi-periodic motion of the patient, and acquiring magnetic resonance (MR) data during the time period such that the acquisition time of the MR data relative to the PET dataset is known. A characteristic of the patient motion is then determined based on the PET dataset and the MR data is processed based on the characteristic of patient motion.

One embodiment of a hybrid PET-MR imaging system includes a PET imaging portion configured to generate PET data to image a patient and an MR imaging portion configured to generate MR data to image the patient. A controller is configured to acquire a PET dataset over a time period from the PET imaging portion, wherein the PET dataset is affected by a quasi-periodic motion of the patient, and acquire MR data with the MR imaging portion during the time period such that the acquisition time of the MR data relative to the PET dataset is known. The controller is further configured to determine a characteristic of patient motion based on the PET dataset and to process the MR data based on the characteristic of patient motion.

Various other features, objects, and advantages of the invention will be made apparent from the following description taken together with the drawings.

BRIEF DESCRIPTION OF THE DRAWINGS

The present disclosure is described with reference to the following Figures.

DETAILED DESCRIPTION

Embodiments of methods and systems for motion detection and compensation in dual-modality PET-MR imagers are disclosed. PET-MR imagers perform both positron emission tomographic (PET) and magnetic resonance (MR) imaging modalities in one system. Hybrid PET-MR imaging systems simultaneously acquire PET and MR data. Each of the PET data and the MR data must be motion corrected, such as gated, to compensate for and reduce the effects of quasi-periodic motion of the patient, including respiratory motion and cardiac motion.

The inventors have recognized that current approaches for motion compensation in PET data and MR data from hybrid PET-MR imaging systems are inadequate. Motion compensation is a long-standing problem for nearly all imaging modalities, and particularly for PET and MR modalities. Uncompensated motion negatively affects the quality of both PET and MR images, and thus many techniques have been derived for "gating" or otherwise motion correcting the data—e.g., to time the data with the quasi-periodic motion of the patient—and for other patient motion detection and correction. Various gating and other motion compensation techniques are available for gating each of the PET and MR data; however, the inventors have recognized that currently available techniques for motion compensation for simultaneously-acquired PET and MR data are inadequate.

Current motion compensation techniques utilized for hybrid PET-MR imaging systems are either a) hardware based, b) MR-data based, c) based on a combination of MR data and PET data, or d) involve separately gating or motion correction MR data and PET data utilizing disparate techniques. Hardware solutions for gating involve the use of external hardware, such as a respiratory bellows for respiratory gating and/or an ECG monitoring system for cardiac gating. These systems require time consuming set up and yield additional points of failure for the imaging modality. For example, utilizing a respirator bellows and/or ECG monitoring requires additional set up time and may require some effort on the part of the medical professional to acquire physiological data of sufficient quality to perform reliable gating. Moreover, scanning may be interrupted if the external physiological monitoring is interrupted for any reason.

Available data-driven methods for gating either involve some form of MR motion detection or involve separately gating or otherwise separately motion compensating PET data from MR data. Data-driven motion compensation is a class of techniques used to identify respiratory and/or cardiac motion based on the acquired data from the imaging modality. In currently-available data driven motion detection for PET-MR system, the acquired MR data is utilized for motion correcting the MR dataset and/or the acquired PET data is analyzed for motion correcting the PET dataset. Thus, separate motion characteristics are used for motion compensation in MR and PET, and such separate motion signals are derived by different means. Data-driven PET motion correction methods are typically retrospective, meaning that motion information is deciphered after data acquisition and the correction happens in post-processing. By contrast, many MR motion detection and correction methods are prospective and occur simultaneously with or prior to MR data acquisition (sometimes referred to as "triggering"), though some retrospective MR gating and other motion compensation methods are currently available.

The inventors have recognized that approaches providing separate motion correction for PET data and MR data yield uncoordinated PET and MR images, and the lack of coordination between the resulting images from the separate modalities that can hamper the effectiveness of the joint imaging. Additionally, separately detecting and correcting motion in both modalities requires a significant amount of processing power that is dedicated to the two separate processes. For example, where data-driven MR gating methods are used, the gating often occupies scan time and thus increases the amount of time required for MR data acquisition and also requires additional work for the technologist operating the system.

In view of the shortcomings of prior art solutions and problems in the relevant art recognized by the inventors, the disclosed system and method were developed that utilize only PET-data driven motion analysis methods for retrospective motion compensation of both the PET data and the MR data. Namely, one or more characteristics of patient motion are extracted from the PET raw data and applied for processing both the PET data and the MR data. The motion characteristics may be, for example, described by a gating signal or by motion vectors indicating optical flow motion. The disclosed methods and systems provide a deviceless approach for motion detection and correction for both modalities with a single set of motion characteristics, such as a single gating signal, thereby maintaining alignment of the images while avoiding the use of external hardware and wasted MR scan time that may occur with MR-data-driven techniques using navigators or interleaved sequences. Since the same motion characteristic is utilized for both PET and MR modalities, image alignment across all gates is ensured, as is consistency between all MR image sequences because the motion information is consistent. The corrected images generated as described herein, including the gated MRI and the gated PET images, can be processed into a single motion-corrected image with increased signal to noise ratio and lesion detectability.

Figure 1:
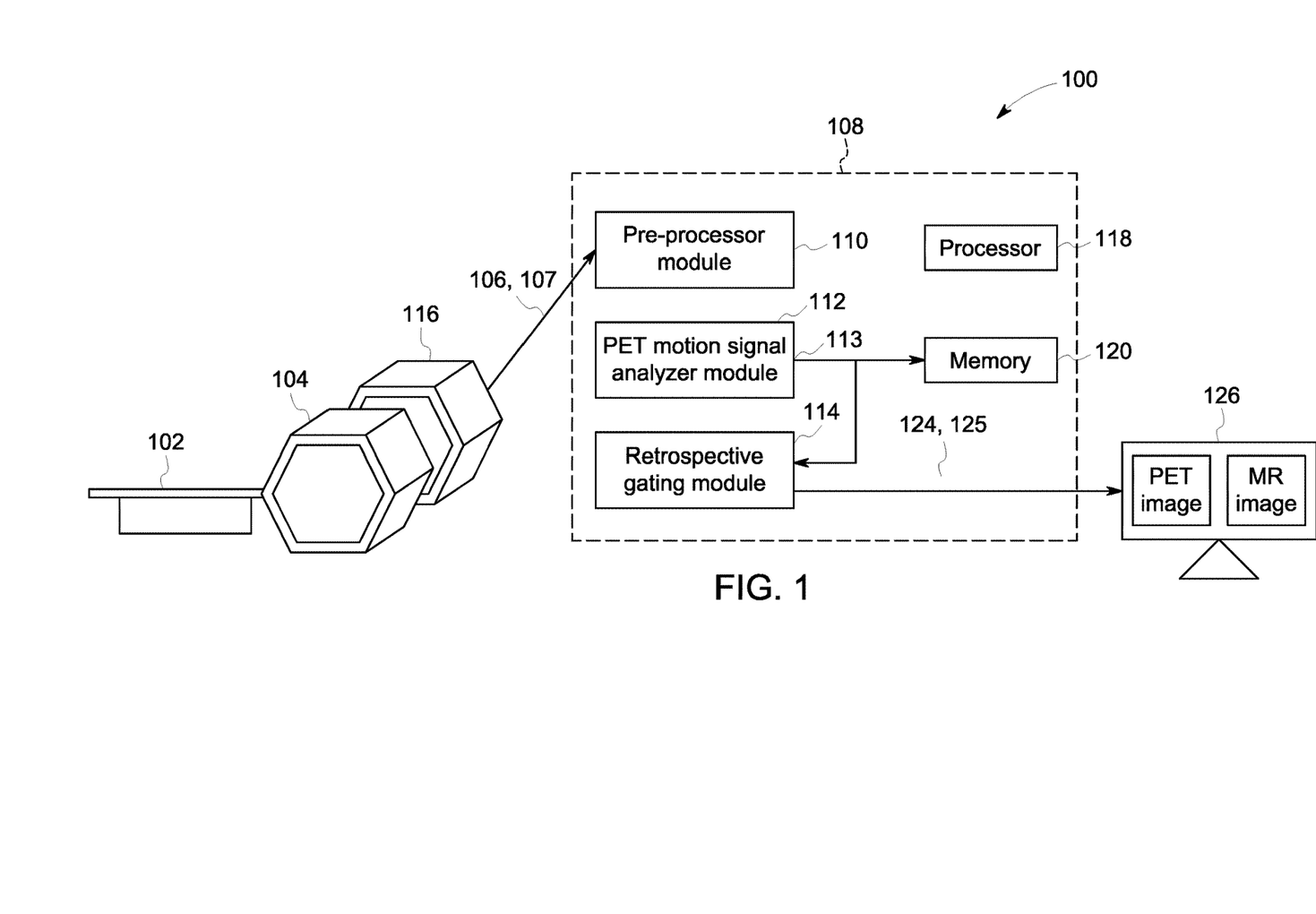
FIG. 1 is a diagram of an embodiment of a PET-MR imager and a system for determining a gating signal for both the PET and MR modalities.

FIG. 1 is a diagram of a hybrid PET-MR imaging system 100 in accordance with an exemplary embodiment. As is well-known in the relevant art, the PET-MR imaging system 100 includes a patient bed 102 receivable by the two imaging modalities, including the PET imaging portion 104 and the MR imaging portion 116. The bed 102 is configured to occupy a plurality of bed positions to facilitate imaging. Each imaging portion 104, 116, or imaging modality, generates an image dataset, wherein the PET imaging portion 104 generates PET data 106 and the MR imaging portion 116 generates MR data 107. A motion correction controller 108 is communicatively coupled to the imaging modalities 104 and 116 and configured to receive the raw data 106 and 107 from each and to generate corresponding motion corrected datasets 124 and 125. The motion corrected datasets 124 and 125 may be displayed on the display device 126 communicatively coupled to the computing system operating as the motion correction controller 108. For example, the motion segmented, or gated, PET data 124 may be displayed as a PET image and the motion gated MR data 125 displayed as an MR image, and the images may be displayed in a time-correlated manner. Alternatively or additionally, the gated PET data 124 and gated MR data 125 may be processed into a single image, which may be displayed on the display 126.

The motion correction controller 108 is configured to generate at least one motion characteristic 113 that describes patient motion and is used for motion correction of the PET and MR data so as to produce the corrected PET data 124 and the gated MR data 125. As described herein, the motion characteristic 113 is generated based on the PET data based on any of various data-driven techniques for deriving quasi-periodic motion information based on the acquired PET data. The motion characteristic 113 may describe respiratory motion or cardiac motion, and in certain embodiments two sets of motion characteristics may be generated, one describing cardiac motion and the other describing respiratory motion for the patient.

The motion correction controller 108 may include a pre-processor module 110, a PET motion signal analyzer module 112 that derives the motion characteristics from the PET data, and a retrospective gating module 114 that utilizes the motion characteristic 113 that is a gating signal 13 (FIG. 5) to generate motion corrected data 124, 125. In other embodiments, module 114 may instead perform a different type of motion correction, such as an optical flow module that retrospectively performs optical flow motion extraction. The motion correction controller 108 further includes a processing system utilizing a processor 118 and a storage system comprising memory 120 for storing software, including the software modules 110, 112, 114, and data generated thereby. The pre-processor module 110 is configured to receive the PET and MR datasets 106 and 107 and correlate and/or organize the raw data from the modalities as appropriate. In certain embodiments, the pre-processor module 110 may be configured to correspond the raw datasets 106 and 107 to a bed position of the patient bed 102 and/or correlate the two datasets 106 and 107 to one another based on acquisition time. For instance, the PET-MR system may have eight bed positions and each raw dataset 106, 107 may be correlated to one of the eight bed positions. In other embodiments, a different number of bed positions may be utilized. The raw PET data 106 and raw MR data 107 may be acquired using a common reference clock, and thus may be easily correlated to bed position and/or to one another based on acquisition time. Alternatively, reference timing data may be generated for one or both of the imaging modalities 104, 106 that may allow correlation of the raw PET data 106 and the raw MR data 107.

The PET motion signal analyzer module 112 is executed by the processor 118 to extract motion information from the PET data in order to determine the motion characteristic 113. The retrospective gating module 114 is then executed to process the raw PET data 106 based on the motion characteristic 113 in order to generate the motion corrected PET data 124, which may be gated PET raw data. The retrospective gating module 114 also processes the raw MR data 107 based on the motion characteristic 113 to generate the motion corrected MR data 125, which may be gated MR raw data. The data is then utilized to reconstruct PET images and MR images, which may then be visually correlated and/or combined and presented on the display 126 to facilitate diagnostics and/or patient treatment.

Figure 2:
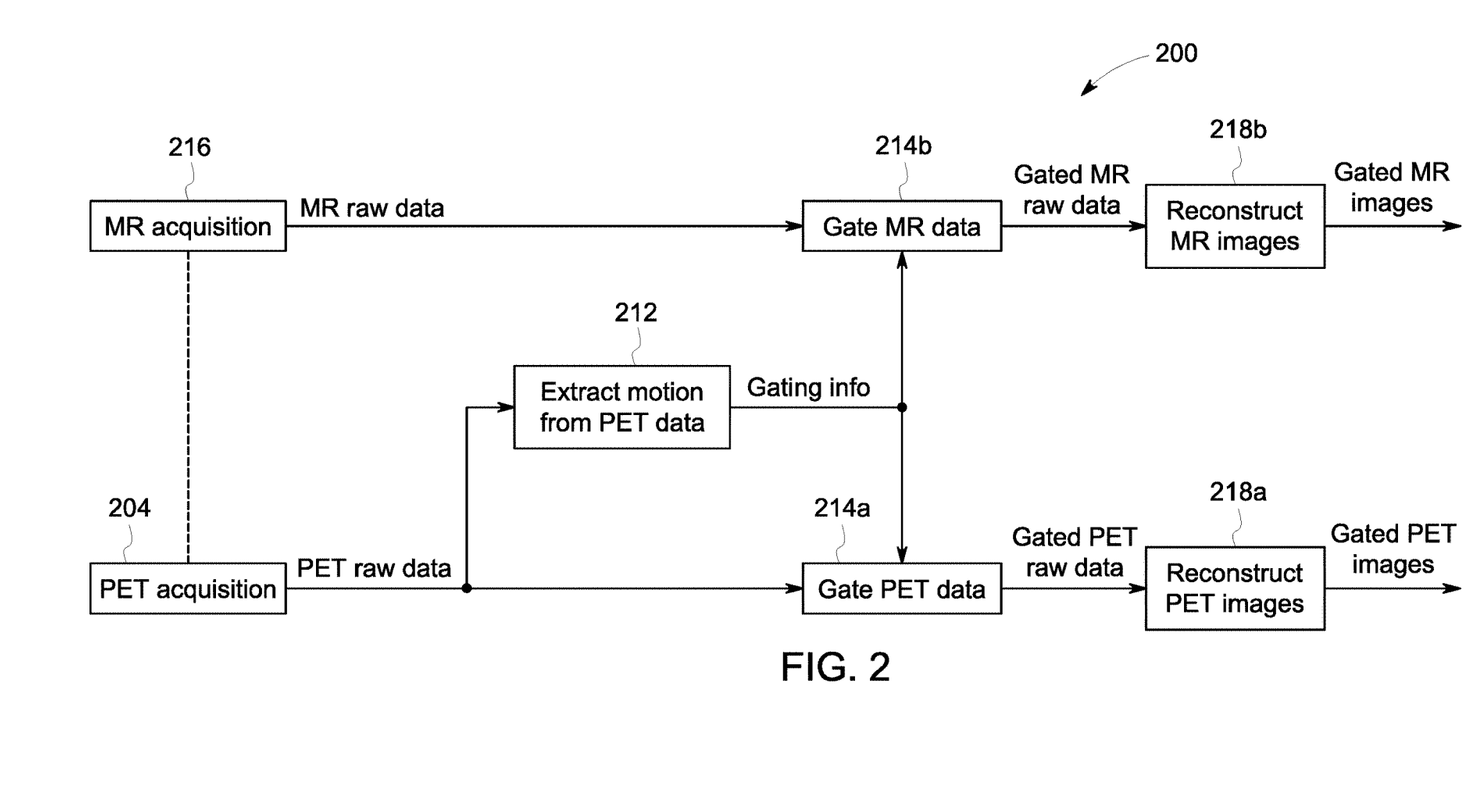
FIG. 2 is a flow chart illustrating one embodiment of a method of gating PET and MR data.
Figure 3:
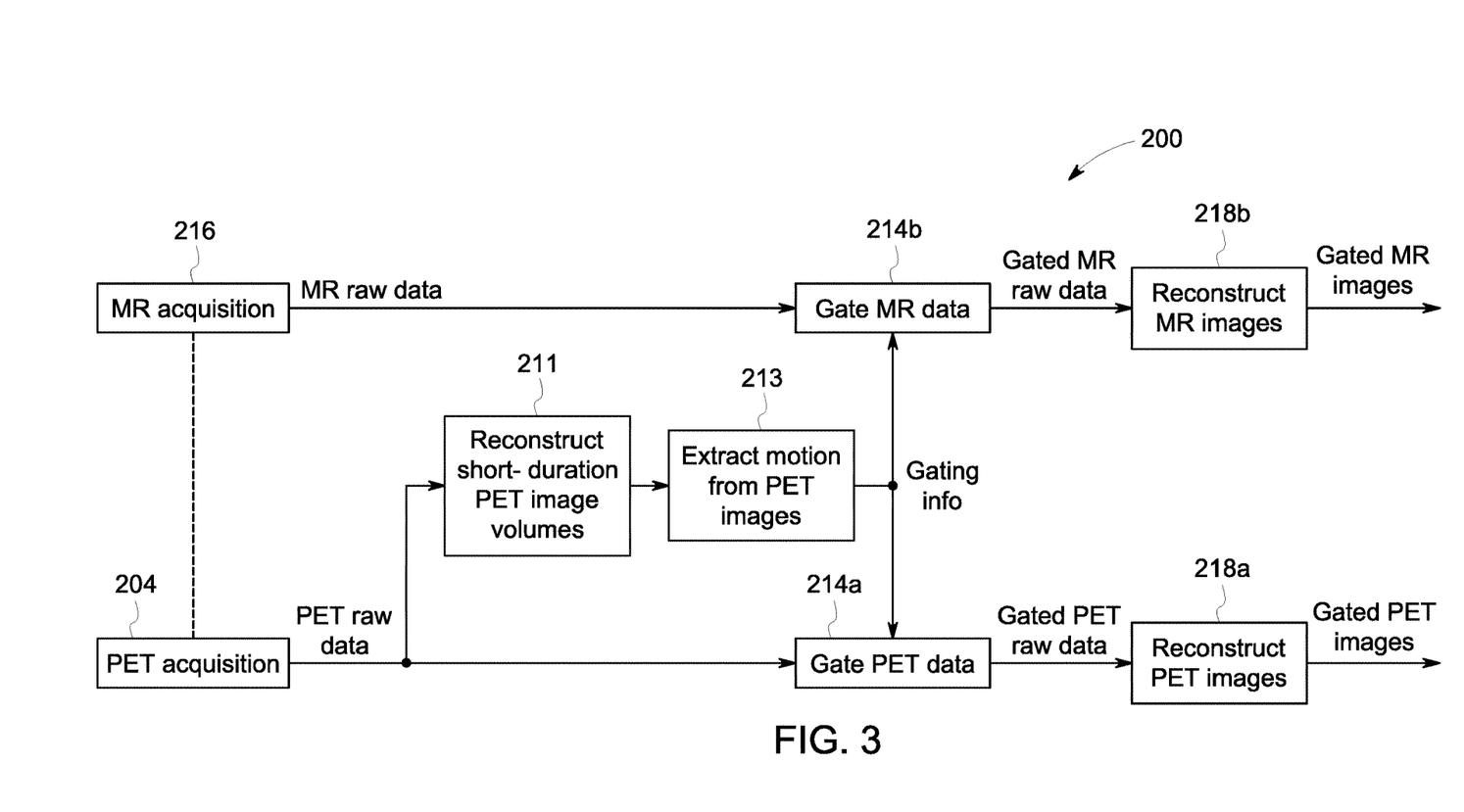
FIG. 3 is a flow chart illustrating another embodiment of a method of gating PET and MR data.
Figure 6:
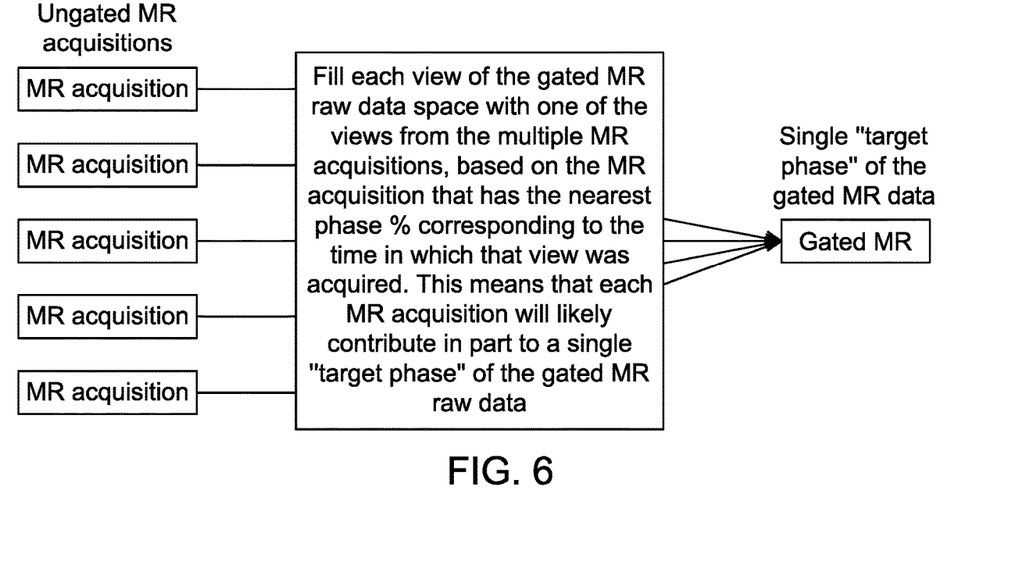
FIG. 6 schematically depicts steps for processing MR data based on a gating signal derived from the PET dataset.
Figure 7:
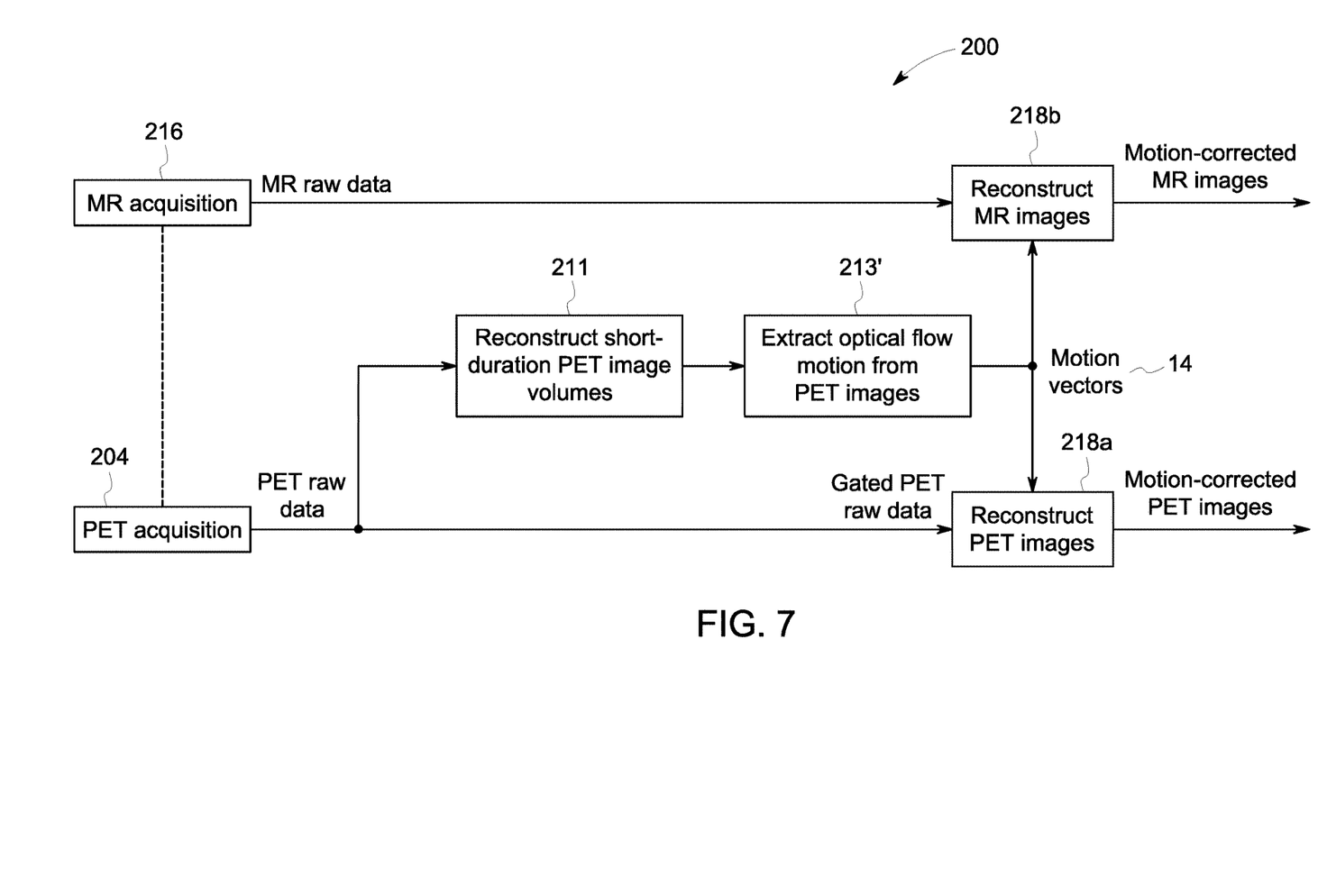
FIG. 7 is a flow chart illustrating another embodiment of motion extraction and compensation for simultaneously acquired PET and MR data.

FIGS. 2 and 3 provide flow charts demonstrating exemplary methods 200 of processing data from hybrid PET-MR systems to generate gated datasets. FIGS. 6 and 7 discussed below also disclose additional exemplary embodiments of method for motion compensation for hybrid PET-MR systems. PET data is acquired at step 204 and MR data is acquired at step 216. The PET and MR data are acquired simultaneously and are time-correlated such that the relative time of the PET raw data and the MR raw data is known. This can be accomplished by saving the time of acquired PET data and the MR readouts with a common reference clock. Steps are then executed at step 212 to extract motion information from the PET raw data in order to generate the gating signal. Various methods of retrospectively extracting motion from PET data may be utilized and are known in the relevant art, examples of which are described herein. The motion characteristic 113 is then utilized to gate the PET data at step 214a and gate the MR data at step 214b. PET images are reconstructed at step 218a based on the gated PET data, and MR images are reconstructed at step 218b based on the gate MR data.

Figure 4A:
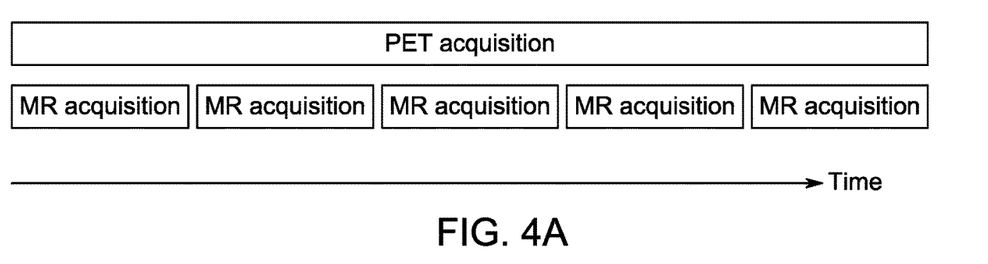
FIGS. 4A-4C schematically represent embodiments of simultaneous PET and MR data acquisition.

In one embodiment, PET data acquisition is performed continuously for a single bed position, whereas the MR data is acquired over multiple MR pulse sequences that are performed at that bed position and are time correlated with the acquired PET data. FIG. 4 schematically illustrates this concept, where PET acquisition is performed continuously for the single bed position and MR data is acquired over multiple sequential pulse sequences performed at the bed position. In one embodiment, the multiple MR pulse sequences are identical, such that all acquisition settings for each pulse are identical. For example, settings such as sequence, repetition time, echo time, flip angle, echo train length, matrix size, slice number and thickness, field of view, and other PSD settings may be identical between MR pulses. FIG. 4A demonstrates a simple case of repeating the same MR acquisition multiple times. The sequences are acquired repeatedly to allow for retrospective gating of the MR data based on the motion determined from the PET data.

Figure 4B:
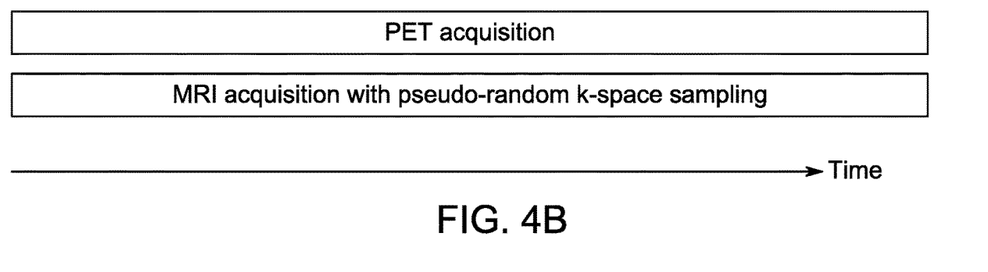

In other embodiments, data processing can be performed for non-identical post sequences, such as where each range of the MR raw data space (k-space) could be correlated and analyzed across all pulses. For example, the acquisition order could also be designed for motion, such as by applying golden angle acquisition. In still other embodiments, pseudo-random sampling may be utilized with a compressed-sensing-based reconstruction algorithm. FIG. 4B schematically demonstrates such an embodiment, where MR data acquisition is performed continuously and simultaneously with the PET data acquisition, with continuous pseudo-random sampling of k-space for a compressed sensing approach to motion correction. These types of acquisitions are designed for reconstruction on a subset of the data (e.g., for gating or other motion correction reconstruction methods). Their acquisition time is longer due to oversampling portions of k-space. As described above, in all such embodiments the relative time of the PET acquisition and the MRI raw data must be known to enable the retrospective gating across modalities.

A variety of methods can be used to extract motion from the short time durations of PET data, such as principal component analysis (PCA), independent component analysis (ICA), respiratory phase analysis, amplitude-based gating, quiescent gating, or others. Typically the PET data is divided into short time durations, which are each processed and compared to derive the motion information. In certain examples, the PET raw data is time divided and processed to extract motion information. In other embodiments, motion information may be extracted from image-space, where short-duration image volumes are reconstructed, as represented at step 211.

Each short-duration PET dataset is analyzed to identify a plurality of motion states, such as respiratory motion states or cardiac motion states. The motion states may be described or classified in various ways to describe the quasi-periodic motion. The motion states are then combined to generate the gating signal, which describes the quasi-periodic motion, such as the respiratory motion or the cardiac motion, over time. FIG. 3 represents an embodiment where PCA is utilized to identify the gating signal based on the PET data.

In one embodiment, PCA is utilized to generate components containing motion information describing cardiac or respiratory motion of the patient. One example of gating using PCA to extract motion information from PET data is described at Thielemans, Kris, et al. "Deviceless gating for PET/CT using PCA." IEEE Nuclear Science Symposium Conference Record. IEEE, 2011, which is hereby incorporated by reference in its entirety. Other PET-data driven gating methods that may be utilized, such as those described at G. Klein, B. Reutter, E. Botvinick, T. Budinger, and R. Huesman, "Finescale motion detection using intrinsic list mode PET information," in Workshop on Mathematical Methods in Biomedical Image Analysis, Los Alamitos, Calif., USA, 2001, vol. 0, pp. 71-78, IEEE Comput. Soc.; Ralph A. Bundschuh, Axel Martinez-Moeller, Markus Essler, MarfaJose J. Martinez, Stephan G. Nekolla, Sibylle I. Ziegler, and Markus Schwaiger, "Postacquisition detection of tumor motion in the lung and upper abdomen using list-mode PET data: a feasibility study," Journal of nuclear medicine: official publication, Society of Nuclear Medicine, vol. 48, no. 5, pp. 758-763, May 2007.; Florian Blither, Mohammad Dawood, Lars Stegger, Frank Wlibbeling, Michael Schafers, Otrnar Schober; Klaus P. Schlifers, "List ModeDriven Cardiac and Respiratory Gating in PET," J Nucl Med, vol. 50, no. 5, pp. 674-681, May 2009.; and Jianfeng He, Graeme, O'Keefe, Sylvia, Gong, Gareth Jones, Tim Saunder, Andrew M. Scott, and Moshi Geso, "A Novel Method for Respiratory Motion Gated With Geometric Sensitivity of the Scanner in 3D PET," IEEE Transactions on Nuclear Science, vol. 55, no. 5, pp. 2557-2565, October 2008, which are each incorporated herein by reference in their entireties. Another method for extracting motion date information for short-duration PET data is described at U.S. Pat. No. 9,471,976, which is hereby incorporated by reference in its entirety.

Figure 5:
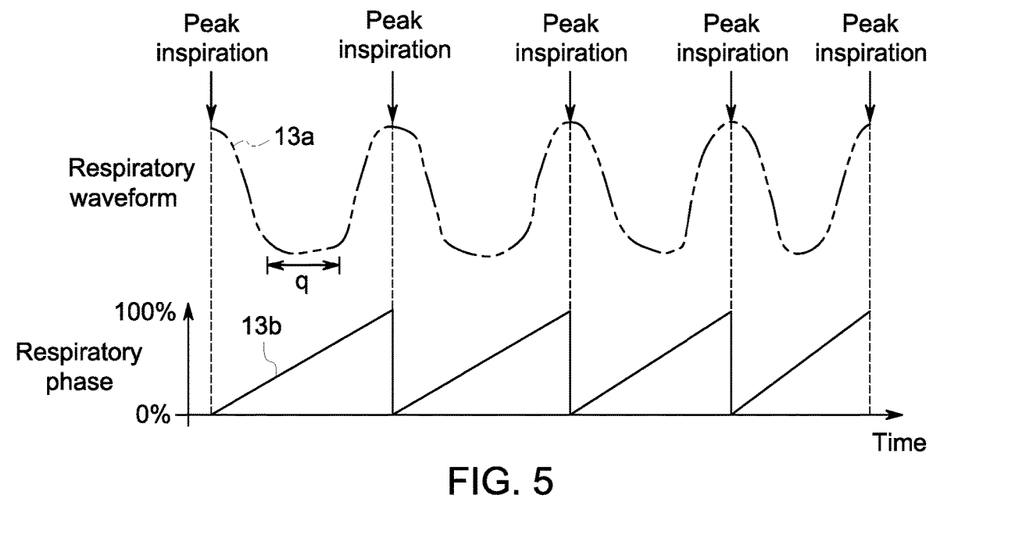
FIG. 5 depicts an exemplary gating signal which is a respiration waveform.

FIG. 5 depicts exemplary gating signals, which in this example describe respiratory motion of the patient but in other examples could describe cardiac motion. In one embodiment, the gating signal is a respiratory waveform 13a.

The respiratory waveform 13a can be used for amplitude-based gating in which gated MR image data is filled with MR raw data views corresponding to the closest waveform amplitude. MR raw data contains many data readouts, sometimes called "views." These views correspond to the MR raw data space (k-space). For each view in a particular gate section or bin, which in the case of the amplitude-based gating would be an amplitude range, the MR raw data is processed to find the corresponding k-space view from the multiple MR acquisitions that has the closest amplitude range to the target bin. For example, one period of the respiration waveform may be divided into a preset number of target bins, such as eight target bins, where one or more of the bins may correspond with the amplitude at peak inspiration and one or more different bins may correspond with the quiescent period q, which is the period of relative inactivity between the end of exhalation and the start of the next inhalation.

A second exemplary gating signal is also shown at FIG. 5 and represents respiratory motion in terms of respiratory cycle phase, shown as the exemplary respiratory phase signal 13*b*. In this example, the respiratory phase gating signal 13*b* is configured such that 0% is assigned to peak inspiration and increases across the respiratory cycle to 100% at the last measurement immediately prior to the next peak. In the depicted example, the respiratory cycle restarts at each peak, where the respiratory phase signal 13*b*, which is the exemplary gating signal, resets to 0% phase.

Phase-based gating using the respiratory phase signal 13*b* is conducted similarly to the amplitude-base gating described above. For each view in a gated target phase, or bin, the gating method is conducted to locate the corresponding k-space view from the multiple acquisitions that has the closest phase percent to the target phase for the particular bin. Thus, the respiratory phase, between 0% and 100%, is divided into target phase bins, such as each representing 12.5% phase sections of the respiratory cycle (i.e., the phase is divided into eight bins).

This concept is illustrated at FIG. 6 where a single target phase, or bin, of the gated MR data is comprised of views from multiple different MR acquisitions acquired over each of multiple sequential pulse sequences. Each view of the dated MR raw data space is filled with one of the views from the multiple MR acquisitions by identifying the MR acquisition that has the nearest phase percent corresponding to the time in which that view was acquired. This means that each MR acquisition will likely contribute in part to a single target phase, or bin, of the gated MR raw data outputted by the retrospective gating module 114 (see FIG. 1).

Figure 4C:
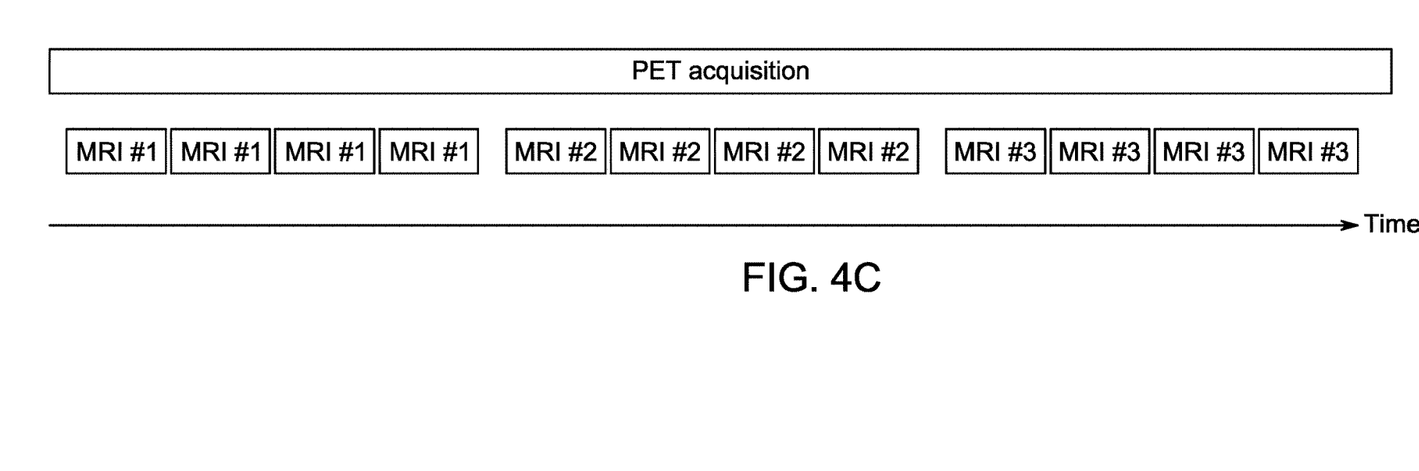

As described above, the gated MR raw data 125 is then utilized to reconstruct MR images or display and analysis by a medical professional. The PET data is also gated using the gating signal 13 (e.g. the respiratory waveform 13*a* or the respiratory phase waveform 13*b*) to generate gated PET raw data. Since the acquired MR data and acquired PET data are gated using the same gating signal 13, the resulting gated raw datasets will correspond in time and the resulting reconstructed images will also correspond in time. Additionally, multiple MR pulse sequences can be used during a single PET acquisition. Namely, the gating or other motion compensation approach can be applied to multiple different MR pulse sequences within the same PET acquisition. This allows the MR motion-corrected images to be created at a consistent reference position for all images to align. FIG. 4C represents three different MR sequences acquired repeatedly for motion correction processing. Each of the sequences would provide motion-corrected images with a common reference position. A common reference frame (or gate) can be applied, allowing alignment between the multiple different MR sequences. A person having ordinary skill in the art will understand in view of the present disclosure that cardiac gating can be conducted similarly as the respiratory example described herein.

FIG. 7 is a flow chart illustrating an alternative motion compensation method to gating. Here, the set of motion characteristics is a set of motion vectors 14 describing the patient motion in the PET data. The motion extraction is performed at step 213' to extract optical flow motion from the PET image volumes. The optical flow approach defines a volumetric summary of motion against a reference frame (e.g., the first time point). This is a quantitative measurement of motion because it is in spatial dimensions. This contrasts with gating signals, which represent a qualitative (or relative) expression of motion. For example, existing optical flow approaches may be applied to determine 3D motion vectors throughout the PET image volume as a function of time, relative to an initial start frame. This motion information is then incorporated directly into the PET and MR reconstructions, which are generated at steps 218*a* and 218*b*. PET and MR reconstruction with motion vectors is exemplified and described at: Lamare, F., et al. "List-mode-based reconstruction for respiratory motion correction in PET using non-rigid body transformations." Physics in Medicine & Biology 52.17 (2007): 5187; Chan, Chung, et al. "Non-rigid event-by-event continuous respiratory motion compensated list-mode reconstruction for PET." IEEE transactions on medical imaging 37.2 (2017): 504-515; Batchelor, P. G., Atkinson, D., Irarrazaval, P., Hill, D. L. G., Hajnal, J., & Larkman, D. (2005); Matrix description of general motion correction applied to multishot images. *Magnetic Resonance in Medicine,* 54(5), 1273-1280; and Zaitsev, M., Maclaren, J., & Herbst, M. (2015). Motion artifacts in MRI: a complex problem with many partial solutions. *Journal of Magnetic Resonance Imaging,* 42(4), 887-901.

This written description uses examples to disclose the invention, including the best mode, and also to enable any person skilled in the art to make and use the invention. Certain terms have been used for brevity, clarity and understanding. No unnecessary limitations are to be inferred therefrom beyond the requirement of the prior art because such terms are used for descriptive purposes only and are intended to be broadly construed. The patentable scope of the invention is defined by the claims, and may include other examples that occur to those skilled in the art. Such other examples are intended to be within the scope of the claims if they have features or structural elements that do not differ from the literal language of the claims, or if they include equivalent features or structural elements with insubstantial differences from the literal languages of the claims.

We claim:

1. A method of processing data from a hybrid PET-MR imaging system, the method comprising:
   acquiring a positron emission tomographic (PET) dataset over a time period, wherein the PET dataset is affected by a quasi-periodic motion of a patient;
   acquiring magnetic resonance (MR) data during the time period such that an acquisition time of the MR data relative to the PET dataset is known;
   determining with a controller a characteristic of patient motion based on the PET dataset;
   processing with the controller the MR data based on the characteristic of patient motion determined from the PET dataset to generate at least one corrected MR image; and
   displaying the at least one corrected MR image.

2. The method of claim 1, wherein the characteristic of patient motion is a gating signal, wherein the gating signal describes the quasi-periodic motion of the patient apparent in the PET dataset.

3. The method of claim 2, wherein the gating signal is retrospectively determined from the PET data using principal component analysis.

4. The method of claim 2, wherein the gating signal indicates a phase of the quasi-periodic motion of the patient.

5. The method of claim 2, wherein the gating signal indicates an amplitude of the quasi-periodic motion of the patient.

6. The method of claim 2, wherein the gating signal describes respiratory motion of the patient or cardiac motion of the patient.

7. The method of claim 1, wherein acquiring the MR data includes acquiring MR raw data over each of multiple MR pulse sequences conducted throughout the time period, and wherein acquiring the PET dataset includes continuously acquiring PET data over the time period.

8. The method of claim 7, wherein each of the multiple MR pulse sequences are identical.

9. The method of claim 2, wherein the PET dataset and the MR data correspond to a bed position, and wherein the gating signal corresponds to the bed position.

10. The method of claim 1, wherein a common reference clock is used for acquiring the PET dataset and the MR data.

11. The method of claim 10, wherein the characteristic of patient motion is a gating signal that describes a respiratory phase of the patient derived from the PET dataset, and wherein processing the MR data based on the gating signal includes selecting the MR data that has a corresponding phase percent and acquisition time.

12. The method of claim 1, wherein the characteristic of patient motion is a set of motion vectors indicating optical flow motion of the PET dataset.

13. A hybrid PET-MR imaging system comprising:
a positron emission tomographic (PET) imaging portion configured to generate PET data of a patient;
a magnetic resonance (MR) imaging portion configured to generate MR data of the patient;
a controller configured to:
acquire a PET dataset over a time period from the PET imaging portion, wherein the PET dataset is affected by a quasi-periodic motion of the patient;
acquire MR data with the MR imaging portion during the time period such that an acquisition time of the MR data relative to the PET dataset is known;
determine a characteristic of patient motion based on the PET dataset;
process the MR data based on the characteristic of patient motion determined from the PET dataset to generate at least one corrected MR image; and
display the at least one corrected MR image.

14. The system of claim 13, wherein the characteristic of patient motion is a gating signal, wherein the gating signal describes the quasi-periodic motion of the patient apparent in the PET dataset.

15. The system of claim 14, wherein the gating signal is retrospectively determined from the PET dataset using principal component analysis.

16. The system of claim 14, wherein the gating signal indicates a phase of the quasi-periodic motion of the patient and/or an amplitude of the quasi-periodic motion of the patient.

17. The system of claim 13, wherein acquiring the MR data includes acquiring MR raw data over each of multiple MR pulse sequences conducted throughout the time period, and wherein the PET dataset includes continuously acquiring PET data over the time period.

18. The system of claim 14, further comprising a bed configured to support the patient being imaged by the PET imaging portion and the MR imagining portion and further configured to occupy a plurality of bed positions;
wherein the PET dataset and the MR data correspond to one of the plurality of bed positions, and wherein the gating signal corresponds to the one of the plurality of bed positions.

19. The system of claim 13, wherein the characteristic of patient motion is a gating signal that describes a respiratory phase of the patient derived from the PET dataset, and wherein processing the MR data based on the gating signal includes selecting the MR data that has a corresponding phase percent and acquisition time.

20. The system of claim 13, wherein the characteristic of patient motion is a set of motion vectors indicating optical flow motion of the PET dataset.

* * * * *